United States Patent
Kashy et al.

(10) Patent No.: US 12,308,207 B2
(45) Date of Patent: May 20, 2025

(54) ENHANCED DEPOSITION RATE BY THERMAL ISOLATION COVER FOR GIS MANIPULATOR

(71) Applicant: APPLIED MATERIALS ISRAEL LTD., Rehovot (IL)

(72) Inventors: Sean Kashy, Gedera (IL); Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 435 days.

(21) Appl. No.: 17/891,028

(22) Filed: Aug. 18, 2022

(65) Prior Publication Data
US 2024/0062990 A1    Feb. 22, 2024

(51) Int. Cl.
*H01J 37/317*  (2006.01)
*C23C 16/16*   (2006.01)
*C23C 16/48*   (2006.01)
*H01L 21/285*  (2006.01)

(52) U.S. Cl.
CPC .......... *H01J 37/3178* (2013.01); *C23C 16/16* (2013.01); *C23C 16/486* (2013.01); *H01L 21/28568* (2013.01); *H01J 2237/006* (2013.01); *H01J 2237/026* (2013.01)

(58) Field of Classification Search
CPC ........ H01J 37/3178; H01J 2237/31749; H01J 2237/002; C23C 14/221; C23C 16/486
See application file for complete search history.

(56) References Cited

U.S. PATENT DOCUMENTS

| | | |
|---|---|---|
| 6,492,261 B2 | 12/2002 | Gavish et al. |
| 8,604,446 B2 | 12/2013 | Ditto |
| 2008/0073587 A1 | 3/2008 | Schmidt et al. |
| 2010/0159370 A1 | 6/2010 | Jong et al. |

(Continued)

FOREIGN PATENT DOCUMENTS

EP    0372061 B1    6/1993

OTHER PUBLICATIONS

Li, et al., "Study of Temperature Influence on Electron Beam Induced Deposition", Journal of Vacuum Science & Technology A, vol. 24, No. 3, May-Jun. 2006, pp. 431-436.

(Continued)

*Primary Examiner* — John A Bodnar
(74) *Attorney, Agent, or Firm* — Kilpatrick Townsend & Stockton LLP

(57) ABSTRACT

A system for depositing material over a sample in a localized region of the sample, the system including: a vacuum chamber; a thermal mass disposed outside the vacuum chamber; a sample support configured to hold a sample within the vacuum chamber during a sample evaluation process; a charged particle beam column configured to direct a charged particle beam into the vacuum chamber toward the sample such that the charged particle beam collides with the sample in a deposition region; a gas injection system configured to deliver a process gas to the deposition region of the sample; and a thermal isolation shield spaced apart from and disposed between the gas injection system and the sample, wherein the thermal isolation shield has a high thermal conductivity and a low emissivity and is thermally coupled to the thermal mass to transfer heat radiated from the gas injection system to the thermal mass.

20 Claims, 8 Drawing Sheets

(56) References Cited

U.S. PATENT DOCUMENTS

2011/0186719 A1      8/2011   Phaneuf et al.
2013/0119252 A1*     5/2013   Kawanami .............. H01J 37/08
                                                    313/631
2015/0137001 A1      5/2015   Hiroki et al.

OTHER PUBLICATIONS

Utke, et al., "Nanofabrication Using Focused Ion and Electron Beams: Principles and Applications", Oxford University Press, Nanomanufacturing Series, ISBN 978-0-19-973421-4, May 2012, 56 pages.
PCT/US2023/029325, "International Search Report and Written Opinion", Nov. 13, 2023, 8 pages.
PCT/US2023/029325, "International Preliminary Report on Patentability", Feb. 27, 2025, 5 pages.

* cited by examiner

ENHANCED DEPOSITION RATE BY THERMAL ISOLATION COVER FOR GIS MANIPULATOR

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon, gallium nitride or other type of wafer that includes one or more integrated circuits (ICs) or other electronic structures formed thereon can be milled with a focused ion beam (FIB) and/or analyzed with a scanning electron microscope (SEM) to study specific characteristics of the circuits or other structures formed on the wafer.

FIB and SEM tools are similar in that each includes a charged particle column that generates a charged particle beam and directs the beam towards a sample. As their names imply, however, the charged particle beam generated by an FIB column is a focused beam of ions while the charged particle beam generated by an SEM column is a focused beam of electrons.

While FIB and SEM tools (as well as FIB-SEM tools, which include both a FIB column and a SEM column) are often used for analyzing and otherwise evaluating structures within a specimen, the tools can also be used for etching or depositing material on a specimen. For example, a focused ion beam can be scanned across a surface of a sample while a gas injection system directs a flow of a deposition precursor gas to the scanned area to selectively deposit material, with nanometer precision, in the scanned area according to a technique that is often referred to as focused ion beam enhanced deposition or FIB-enhanced deposition for short. During a FIB-enhanced deposition process, molecules of the injected gas adhere to a surface of the sample. As the ion beam is scanned across a region of the sample, the energy released by the collision cascade of the bombarding ions causes dissociation of the surface-adsorbed precursor molecules, resulting in sold deposition on the surface together with the release of volatile residues. As another example, a deposition gas can be introduced to a sample in the vicinity in which an electron beam is scanned across the surface of a sample in order to deposit material under an SEM column.

While FIB-enhanced deposition has been used in many different instances and applications, improved deposition techniques are continuously being sought.

BRIEF SUMMARY OF THE INVENTION

Embodiments of the disclosure pertain to an improved method and system for charged particle beam enhanced deposition, such as focused ion beam enhanced deposition. Embodiments can be used to increase the deposition rate of charged particle beam enhanced deposition and thereby increase the throughput of processes that employ charged particle beam enhanced deposition. While embodiments of the disclosure can be used to increase the rate at which materials are deposited over a variety of different types of samples, some embodiments are particularly useful in depositing materials over samples that are semiconductor wafers or similar specimens.

In some embodiments, a system for depositing material over a sample in a localized region of the sample is provided. The system can include: a vacuum chamber; a thermal mass disposed outside the vacuum chamber; a sample support configured to hold a sample within the vacuum chamber during a sample evaluation process; a charged particle beam column configured to direct a charged particle beam into the vacuum chamber toward the sample such that the charged particle beam collides with the sample in a deposition region; a gas injection system configured to deliver a process gas to the deposition region of the sample; and a thermal isolation shield spaced apart from and disposed between the gas injection system and the sample, wherein the thermal isolation shield has a high thermal conductivity and a low emissivity and is thermally coupled to the thermal mass to transfer heat radiated from the gas injection system to the thermal mass.

In various implementations, the system can include one or more of the following features. The charged particle beam column can be a focused ion beam column and the charged particle beam can be a focused ion beam. The thermal isolation shield can have an emissivity coefficient of 0.1 or less. The system can further include a heating element operatively coupled to heat the gas injection system above room temperature. The thermal isolation shield can comprise aluminum. The gas injection system can include a gas nozzle that includes a channel formed through a distal end of the nozzle and aligned to allow the focused ion beam to pass through the channel to the sample. The gas injection system can include a base portion and a nozzle extending away from the base portion. The base portion can have a thermal mass that is significantly larger than a thermal mass of the nozzle and the thermal shield can be disposed between the base portion and the sample and between a portion of the nozzle and the sample. The gas nozzle can comprise a high emissivity material. A distal end of the gas nozzle can extend beyond an outer periphery of the thermal shield. The distal end of the gas nozzle can be coated with a low emissivity material. The gas nozzle can comprise stainless steel and the distal end of the gas nozzle can be coated with aluminum. A distal end of the gas nozzle can comprise a low emissivity material. The distal end of the gas nozzle can comprise aluminum. The thermal mass can be a chamber cover. The thermal mass can weigh at least 100 kg.

In some embodiments, a method of depositing material over a sample in a deposition region of the sample with a focused ion beam column is provided. The method can include: positioning a sample within a vacuum chamber such that the deposition region is under a field of view of the focused ion beam column; injecting a deposition precursor gas, with a gas injection system, into the vacuum chamber at a location adjacent to the deposition region; generating a focused ion beam with the focused ion beam column and focusing the ion beam within the deposition region of the sample; and scanning the focused ion beam across the deposition region of the sample to activate molecules of the deposition gas that have adhered to the sample surface in the deposition region and deposit material on the sample within the deposition region. Additionally, while the focused ion beam is scanned across the deposition region, the method can shield the sample from heat radiated from the gas injection system with a thermal isolation shield comprising a high conductivity, low emissivity material.

In various implementations, the method can include one or more of the following. The charged particle beam column can be a focused ion beam column and the charged particle beam can be a focused ion beam. The method can further include heating the gas injection system above room temperature. The thermal isolation shield can comprise aluminum. The gas injection system can include a gas nozzle that includes a channel formed through a distal end of the nozzle and aligned to allow the focused ion beam to pass through the channel to the sample. The gas injection system can include a base portion and a nozzle extending away from the base portion. The base portion can have a thermal mass that is significantly larger than a thermal mass of the nozzle and the thermal shield can be disposed between the base portion and the sample and between a portion of the nozzle and the sample.

To better understand the nature and advantages of the present disclosure, reference should be made to the following description and the accompanying figures. It is to be understood, however, that each of the figures is provided for the purpose of illustration only and not drawn to scale and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure pertain to an improved method and system for charged particle beam enhanced deposition, such as focused ion beam enhanced deposition.

Embodiments can be used to increase the deposition rate of charged particle beam enhanced deposition and thereby increase the throughput of processes that employ charged particle beam enhanced deposition. In some instances, embodiments can also be used to change the chemical composition of the deposited material improving the deposition process.

Example Focused Ion Beam (FIB) Tool

Figure 1:
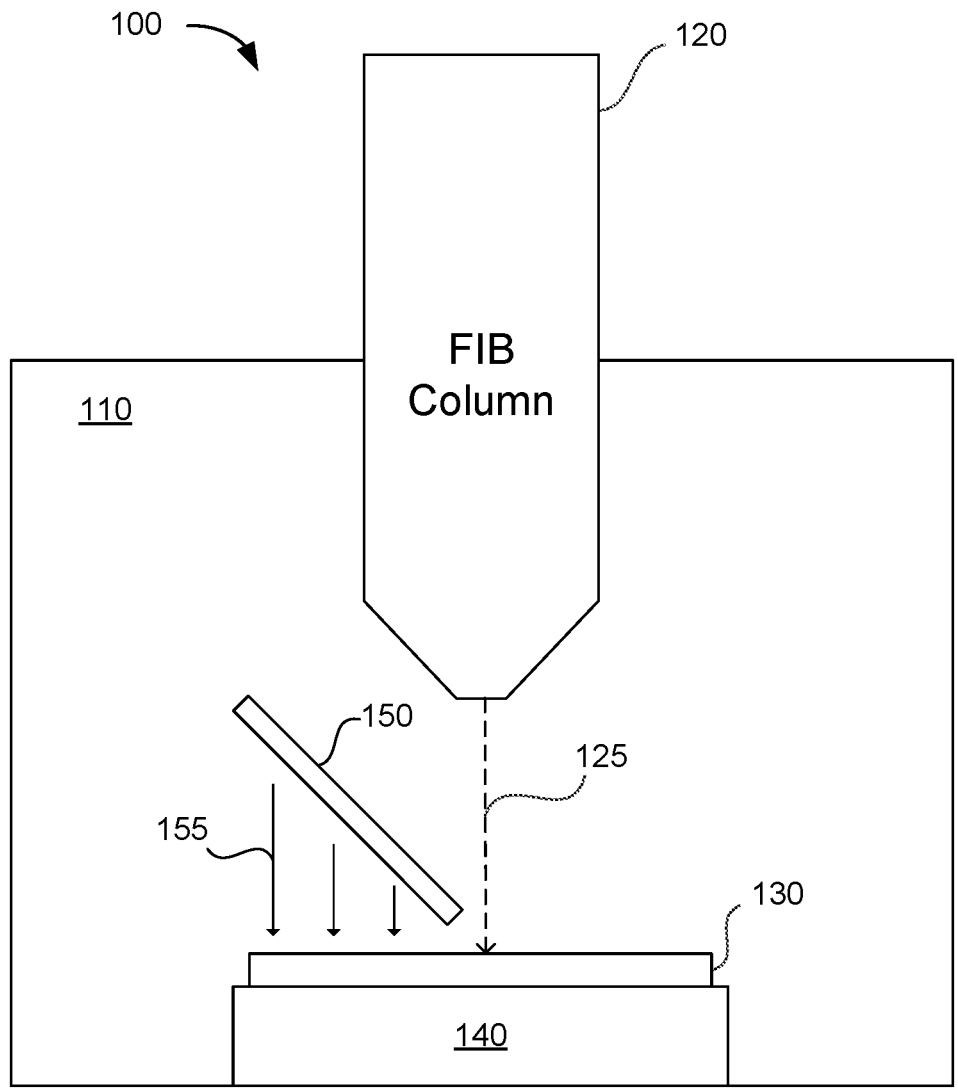
FIG. 1 is simplified schematic illustration of a sample particle beam deposition system.

In order to better understand and appreciate the disclosure, reference is first made to FIG. 1, which is a simplified schematic illustration of a previously known focused ion beam (FIB) evaluation system 100. FIB system 100 can be used for, among other operations, particle enhanced deposition of various materials over semiconductor wafers.

As shown in FIG. 1, system 100 can include, among other elements, a vacuum chamber 110 along with a focused ion beam (FIB) column 120. A supporting element 140 can support a sample 130 (e.g., a semiconductor wafer) within chamber 110 during a processing operation in which the sample 130 (sometimes referred to herein as an "object" or a "specimen") is subject to a charged particle beam from FIB column 120.

During a processing operation, one or more gases can be delivered into chamber 110 by a gas injection system 150 for certain operations. For simplicity of explanation gas injection system 150 is illustrated in FIG. 1 as a nozzle, but it is noted that gas injection system 150 can include gas reservoirs, gas sources, valves, one or more inlets and one or more outlets, among other elements. In some embodiments gas injection system 150 can be configured to deliver gas to a localized area of sample 130 that is exposed to the scan pattern of the charged particle beam as opposed to delivering gas to an entire upper surface of the sample. For example, in some embodiments gas injection system 150 has a nozzle opening diameter measured in hundreds of microns (e.g., between 400-500 microns) that is configured to deliver gas directly to a relatively small portion of the sample's surface that encompasses the charged particle beam scan pattern.

FIB column 120 is connected to vacuum chamber 110 so that the charged particle beam generated by the FIB column propagates through a vacuumed environment formed within vacuum chamber 110 before impinging on sample 130. For example, as shown in FIG. 1, FIB column 120 can generate a focused ion beam 125 that travels through the vacuum environment of chamber 110 before colliding with sample 130.

FIB column 120 can mill (e.g., drill a recess in) sample 130 by irradiating the sample with charged particle beam 125 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 3,000 volts to 30,000 volts. The beam current is typically in the range from several pico amps to several micro amps, depending on the FIB instrument configuration and the application, and the pressure is typically controlled between 10-10 to 10-5 mbar in different parts of the system and in different operation modes.

A milling process can be done by, for example: (i) locating a location of interest that should be milled in order to remove a portion (e.g., a portion of one or more layers) of material from the sample, (ii) moving the sample (e.g., by the mechanical supporting element 140) so that the sample is located under the field-of-view of the FIB unit, and (iii) milling the sample to remove a desired amount of material in the location of interest. The milling process can include forming a recess in the sample (usually sized a few microns to few hundreds of microns in the lateral dimensions).

The milling process typically includes scanning a charged particle beam back-and-forth (e.g., in a raster or other scan pattern) across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of 150, 200 or 300 mm while each area scanned on the wafer (i.e., the area milled) can be a rectangular area having a width and/or length measured in microns or tens of microns. Each iteration (or frame) in which the ion beam is scanned across the region being milled is typically measured in microseconds and removes a very small amount of material (e.g., as low as 0.01 atomic layers using a low i-probe (e.g., 10 pA) or as much as 1000 atomic layers using a high i-probe (e.g., 1000 nA)) such that the scan pattern is repeated many thousands or even millions of times to etch a hole to a desired depth.

During a milling operation the charged particle beam 120 generated by FIB column 120 propagates through the vacuumed environment formed within vacuum chamber 110 before impinging on sample 130. The milling process generates byproducts such as molecules, atoms and ions of the material being milled along with secondary electrons. For example, as an ion hits the sample surface with a relatively high energy level, the ion can begin a collision cascade that transfers momentum and energy from the ion to the sample until the ion is stopped and implanted. The momentum and energy transfer during the collision cascade can cause the dislocation of atoms, the ionization of atoms and the generation of phonons (heat). The cascade can reach the sample surface causing the sputtering of atoms having enough momentum and energy to escape the solid sample and generating secondary ions and electrons as a combination of ionization and sputtering that also escape the sample surface. The secondary ions or secondary electrons can be detected by an appropriate detector (not shown). The detected secondary ions or secondary electrons can then be used to analyze characteristics of the milled layers and the structure.

While not shown in FIG. 1, FIB system 100 can include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Charged Particle Enhanced Deposition Process

Some embodiments of the disclosure can deposit material over a sample positioned on support 140 by initiating a deposition process under FIB column 120. As an example, in some embodiments FIB column 120 can be used in a deposition mode to initiate a focused ion beam enhanced deposition process. Towards this end, a deposition gas can be supplied to the sample 130 by gas injection system 150 and energy from the FIB column 120 can generate a beam of ions 125. The cascade of impinging ions can, in turn, activate the deposition gas resulting in deposition of material on the sample that is localized to the regions of the sample that over which the ion beam is scanned. Thus, deposition that occurs according to such embodiments does not simultaneously occur across the entire surface of the sample or wafer being processed. Instead, deposition occurs only in the general areas where the ion beam (which, as a non-limiting example, can have a diameter in the range of 0.5 to 25 microns for a xenon plasma) impinges upon the wafer and as the ion beam is scanned across those areas of the wafer. Thus, deposition according to some embodiments can be carried out with micron level resolution.

The rate at which material is deposited in such a focused ion beam (FIB) enhanced deposition process can have a direct impact on the throughput of the process. Thus, higher deposition rates can equate to a higher throughput. During a FIB deposition process, the rate at which material is deposited over the sample depends on a number of different factors including the energy level of the charged particle beam, the precursor gas used for the deposition process, the type of material on the surface of the sample and the temperature of the sample surface. For example, in a FIB enhanced deposition process, the molecular sticking coefficient is one of the parameters that governs deposition rate. The sticking coefficient is a measure of the probability of an airborne molecule to stick to the surface of a sample upon contact. The deposition rate of a FIB enhanced deposition process increases with an increase of the deposition gases sticking coefficient. For some precursor gases the sticking coefficient is inversely dependent on temperature. That is, an increase in temperature decreases the sticking coefficient while a decrease in temperature increases the sticking coefficient.

For some applications it is important to heat gas injection system 150 well above room temperature (e.g., to about 85-95 degrees Celsius in some applications) in order to avoid deposition of material from gases flowing through the gas injection system that might interfere with gas flow to the milled region or clog a portion of the gas injection system, such as the gas nozzle, entirely. Gas injection system 150, which can include various components be made from a metal such as stainless steel that has a relatively high emissivity, can be operatively coupled to a heater element (not shown) that heats the gas injection system to a sufficient temperature to prevent or otherwise reduce deposition within the gas injection system. In some embodiments, the gas injection system can include one or more components, in addition to a gas nozzle, that combined present a relatively large thermal mass near the sample (e.g., a thermal mass at least as large as the sample itself).

During an FIB enhanced deposition process, the heated gas injection system 150 radiates heat (as shown by arrows 155) towards sample 130. The radiated heat can undesirably increase the temperature at the surface of sample 130 in the area at which ion beam 125 collides with the sample. The increased surface temperature can, in turn, decrease the sticking coefficient of deposition gases introduced by gas injection system 150 to the sample surface thus undesirably lowering the deposition rate.

Figure 2:
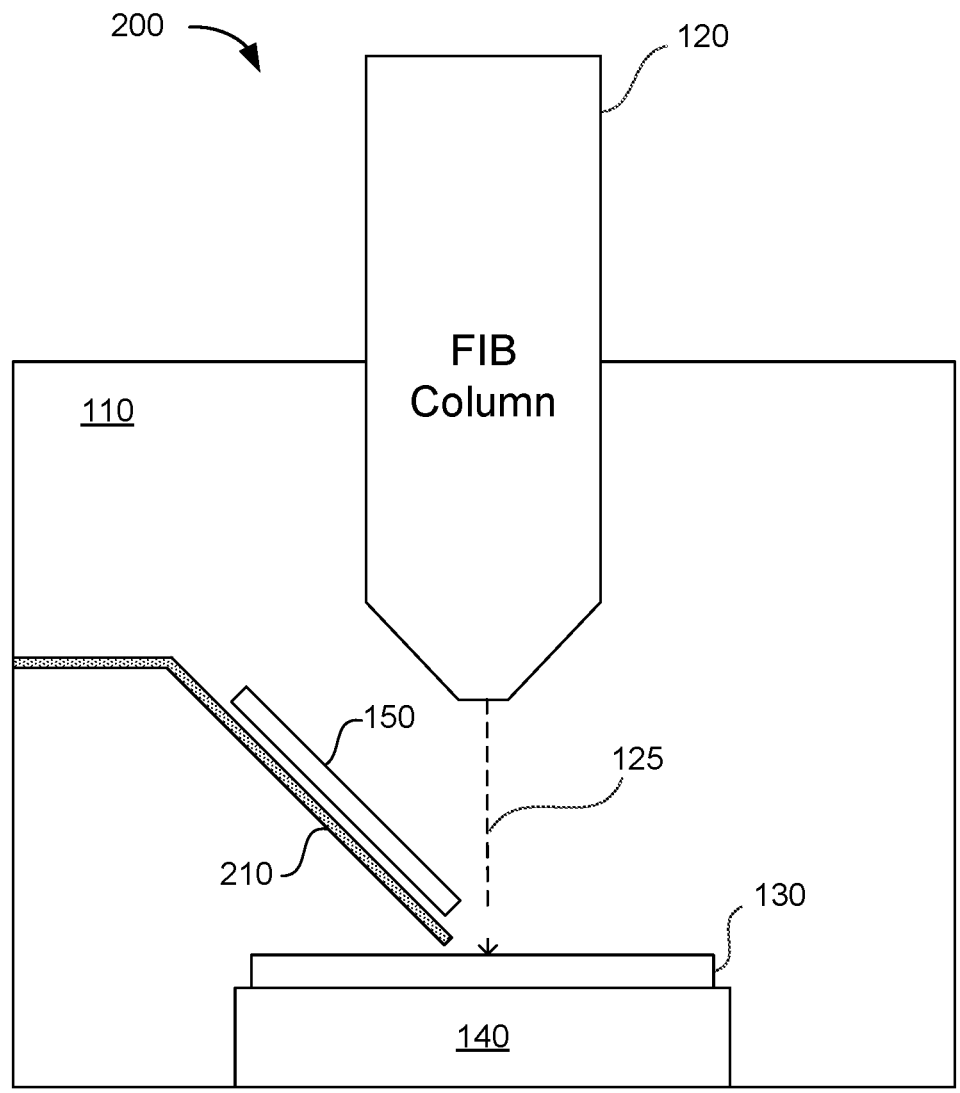
FIG. 2 is simplified schematic illustration of a particle beam deposition system according to some embodiments disclosed herein.

Increasing the Deposition Rate of a Charged Particle Enhanced Deposition Process In order to promote a higher deposition rate, and thus a higher throughput rate, some embodiments of the disclosure can include a thermal isolation shield around portions of a gas injection system 150 to reduce or prevent heat that radiates from the gas injection system from reaching the surface of the sample. FIG. 2 is simplified schematic illustration of a sample FIB system 200 according to some embodiments disclosed herein. FIB system 200 includes many of the same components as system 100 discussed above, including for example: a vacuum chamber, FIB column, a sample support that can support a sample during a processing (e.g., FIB enhanced deposition) operation, and a gas injection system. Thus, for ease of reference like reference numbers are used for like components, and to avoid unnecessary repetition descriptions of those like components are not repeated.

FIB system 200 further includes a thermal isolation shield 210 positioned between gas injection system 150 and sample 130. Thermal isolation shield 210 can be made from a material having good thermal conductivity but low emissivity (i.e., an emissivity coefficient of 0.1 or less), such as aluminum, and can be thermally coupled to chamber cover or similar large thermal mass disposed away from sample 130 and outside of vacuum chamber 110. For example, in some embodiments, FIB system 200 includes a large, heavy chamber cover (not shown) on top of vacuum chamber 110. The chamber cover, which can be electrically grounded and kept at or near room temperature, can weigh more than 100 kgs, and in some embodiments more than 200 kgs, and can be made from a heat conducting metal, such as stainless steel or aluminum.

Figure 3:
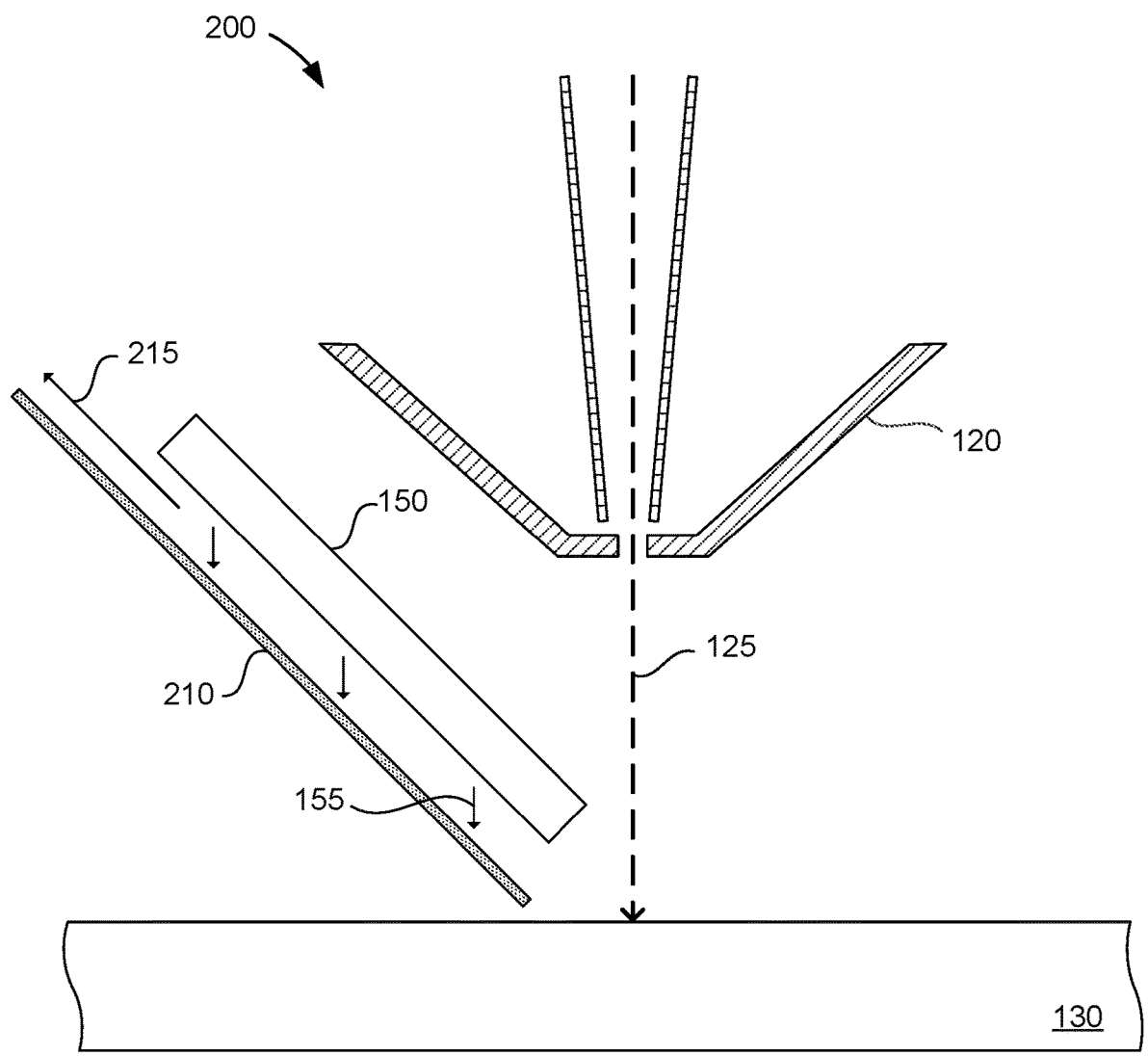
FIG. 3 is an expanded view of a portion of particle beam deposition system shown in FIG. 2.

Thermal isolation shield 210 is spaced apart from gas injection system 150 such that the thermal isolation shield is positioned between the sample and portions of the gas injection system without being in physical contact with gas injection system 150. Thus, there is no thermal conductivity between thermal isolation shield 210 and gas injection system 150. Instead, thermal isolation shield 210 can be in direct physical contact with and thermally coupled to the chamber cover (or other thermal mass) which is kept at a temperature below that of the gas injection system. In this manner, the thermal isolation shield can dissipate heat generated along gas injection system 150 away from sample 130 to the chamber cover. For example, as shown in FIG. 3, which is an expanded view of a portion of FIB system 200, heat (indicated by arrows 155) that radiates from gas injection system 150 is blocked or captured by thermal isolation shield 210 and transported away from sample 130 towards the chamber cover (or a similarly large thermal mass outside of chamber 110 that can be kept, for example, at room temperature) as indicated by arrow 215. Because, thermal isolation shield 210 has low emissivity, the amount of heat that it reradiates towards sample 130 is minimal (and significantly less than the heat radiated by the gas injection system).

Figure 4:
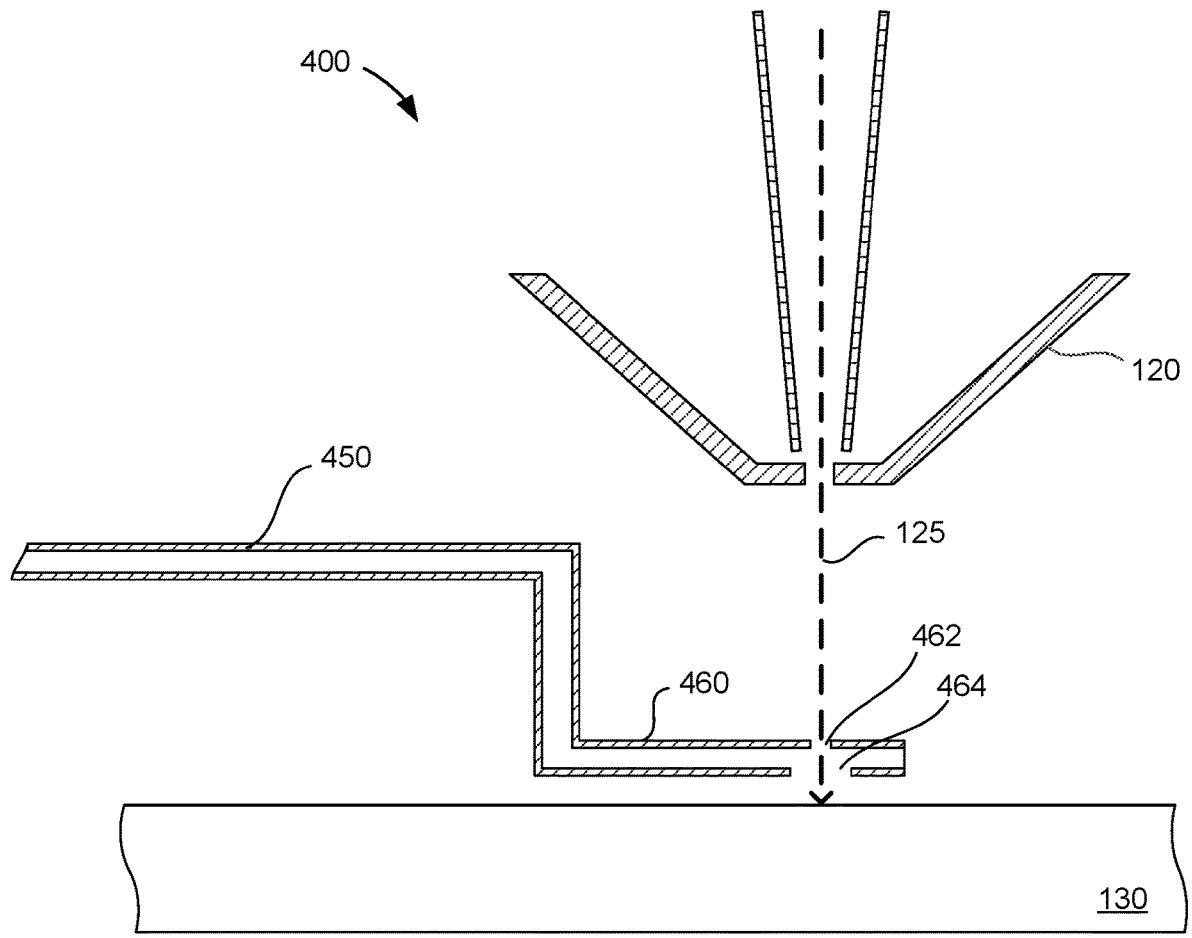
FIG. 4 is a simplified cross-sectional illustration of a portion of a sample focused ion beam system.

Some FIB systems includes a gas injection system in which a gas nozzle has an end portion positioned directly between an end of the FIB column and the sample. For example, FIG. 4 depicts a portion of an FIB system 400 that includes a gas injection system 450 that includes a gas nozzle 460 positioned between the distal end of FIB column 120 and sample 130. Gas nozzle 460 can be in a fixed relationship in the X and Y planes with respect to FIB column 120 and moveable within the Z plane to allow the nozzle to get in close proximity (e.g., as close as 300 microns in some embodiments) to an upper surface of sample 130. As depicted, gas nozzle 460 includes a hole or channel 462 formed through the gas nozzle and a nozzle opening 464. Channel 462 allows ion beam 125 to pass through the gas nozzle and collide with sample 130 at a location directly below the nozzle. Nozzle opening 464, which can have a diameter larger than that of channel 462, allows gas to exit nozzle 460 at a location adjacent to a surface of the sample 130.

Figure 5A:
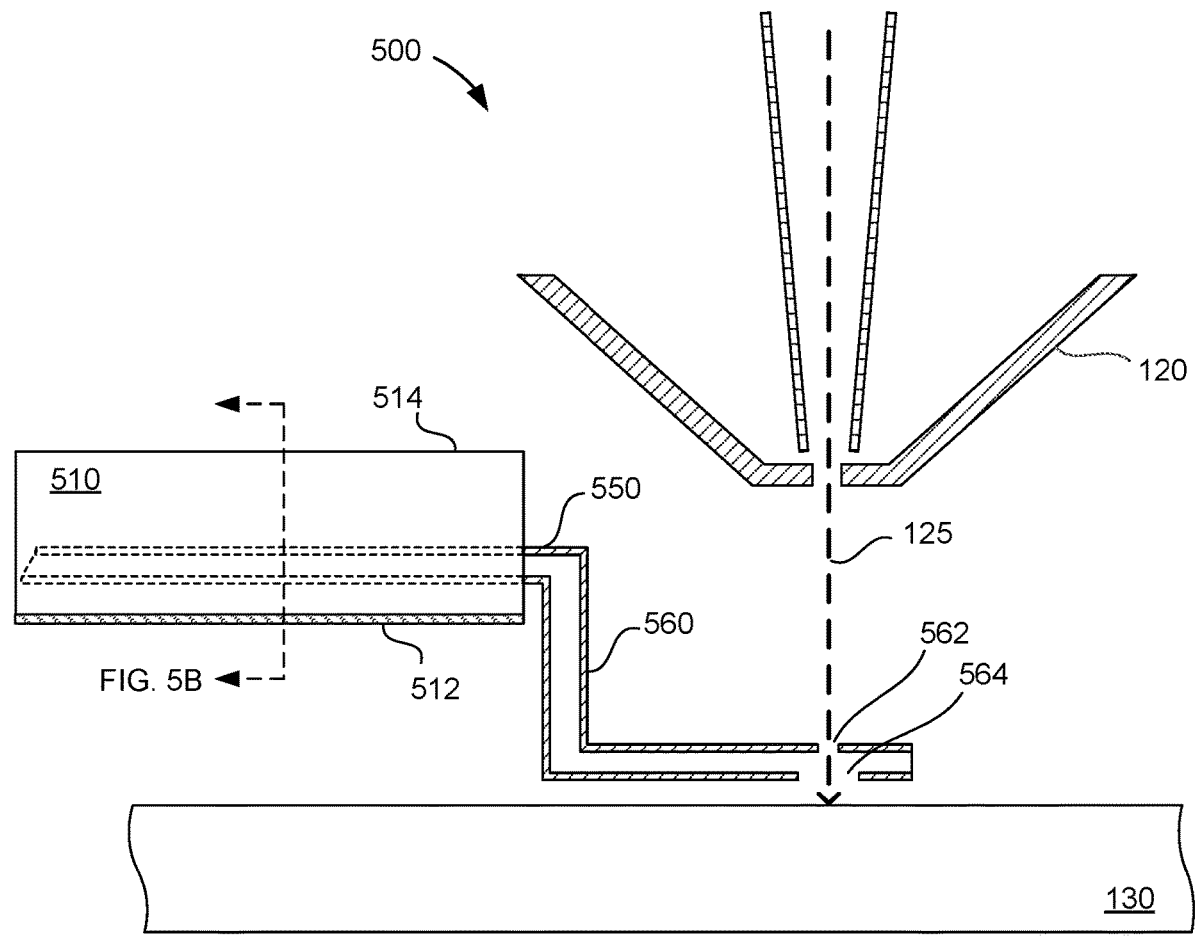
FIG. 5A is a simplified cross-sectional illustration of a portion of a sample focused ion beam system in accordance with some embodiments disclosed herein.

FIG. 5A is a simplified cross-sectional illustration of a FIB deposition system 500 according to some embodiments. As shown in FIG. 5A, FIB deposition system 500 includes a gas injection system 550, which similar to gas injection system 450, includes a gas nozzle 560 that includes channel 562 to allow ion beam to pass through the gas injection nozzle and collide with sample 130 at a location directly below the nozzle and a nozzle opening 564 that allows the gas to exit nozzle 560 at a location adjacent to an upper surface of sample 130. Gas injection system 550 and gas nozzle 560 are configured such that the nozzle opening 564 of gas nozzle 560 can be positioned within a Z plane in very close proximity to sample 130 (e.g., as close as 300 microns in some embodiments).

Figure 5B:
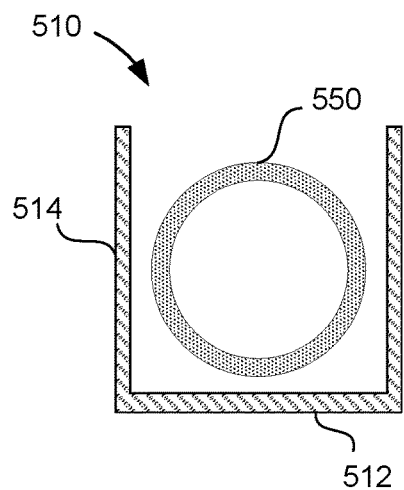
FIG. 5B is a simplified cross-sectional illustration of a portion of thermal thermal isolation shield shown in FIG. 5A.

FIB deposition system 500 also includes a thermal isolation shield 510 that partially surrounds a portion of gas injection system 550 and is positioned between the gas injection system 550 and sample 130. For example, as shown in FIG. 5B, which is a simplified cross-sectional illustration of a portion of thermal isolation shield 510, shield 510 includes a bottom wall 512 and side walls 514 that surround gas injection system 550 on at least three sides. In order to allow gas opening 564 of gas nozzle 560 to be positioned in very close proximity to sample 130, in some embodiments thermal isolation shield 510 does not extend between an end portion of gas nozzle 560 and sample 130. The end of nozzle 560 represents a relatively small fraction of the overall thermal mass of gas injection system 550. Thus, not covering the end portion of nozzle 560 with thermal isolation shield 510 does not result in a significant amount of heat radiating from the nozzle to sample 130.

Still, some embodiments coat at least the portions of gas nozzle 460 that are not covered by thermal isolation shield 510 with a low emissivity coating, such as aluminum. Thus, for example, in some embodiments, gas nozzle 560 can be made from a relatively high emissivity metal, such as stainless steel, coated with a low emissivity layer, such as aluminum. The aluminum coating can be applied using any known and suitable coating technique, such as electroplating. In still other embodiments, gas injection nozzle 460 can be made from a low emissivity material, such as aluminum.

While various embodiments discussed above included a gas injection system with a gas nozzle that had a relatively linear shape, in other embodiments the gas nozzle can be bent to include various curves so that there are no right angles within the path that gases traverse within the nozzle. One example of a suitable nozzle design is described in commonly assigned U.S. Pat. No. 6,992,288 which is hereby incorporated by reference in its entirety.

Figure 6:
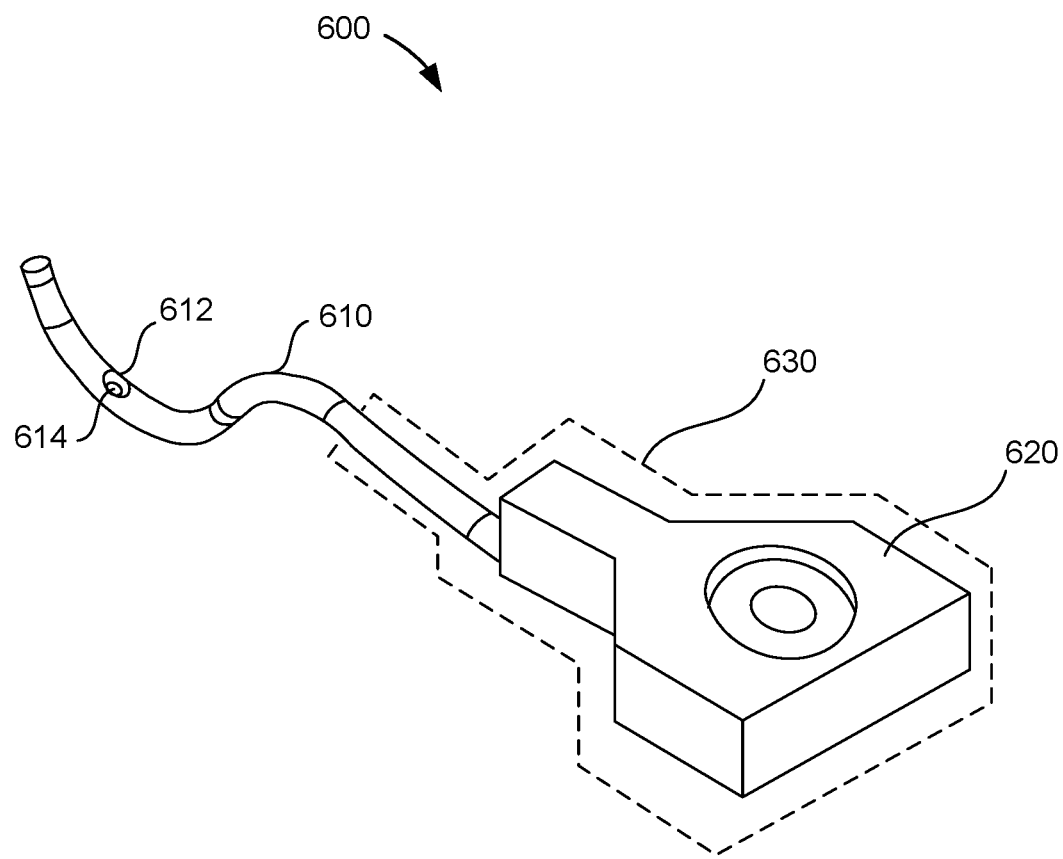
FIG. 6 is a simplified illustration of a gas injection system according to some embodiments disclosed herein.

Reference is now made to FIG. 6, which is a simplified illustration of a gas injection system 600 according to some embodiments. As shown in FIG. 6, gas injection system 600 can include a gas nozzle 610 and a base portion 620. Gas nozzle 610 includes a channel 612 that allows an ion beam (e.g., ion beam 125) to pass through the gas nozzle and collide with a sample at a location directly below the nozzle as described above with respect to channel 562. Gas nozzle 610 also includes a nozzle opening 614 at a bottom surface of the gas nozzle in the region of channel 612 that delivers gas introduced into the gas injection system to an upper surface of a sample.

Base portion 620 supplies gas to the nozzle portion 610 and can be a relatively large metallic object that is coupled to a heater (e.g., a resistive heater) to heat gas injection system 600, including nozzle 610, to a desired temperature to prevent or otherwise reduce deposition within the gas injection system as discussed above. In some embodiments, base portion 620 can be positioned within the vacuum chamber of an FIB tool, such as within vacuum chamber 110, and radiate heat towards a sample being processed. Thus, some embodiments of the disclosure can include a thermal isolation shield disposed between both gas nozzle 610 and base portion 620 to capture heat radiated from the nozzle 610 and base portion 620. As described above, the thermal isolation shield can be thermally coupled to a heat sink having a large thermal mass, such as a chamber cover, disposed outside the chamber to dissipate the heat away from the sample as described above. A footprint of a thermal isolation shield 630 is depicted in FIG. 6 in dashed lines representing a bottom surface of the thermal isolation shield 630 that is positioned underneath gas injection system 600 and disposed between the gas injection system and a sample. As shown in FIG. 6, an end portion of gas nozzle 610 can extend beyond a periphery of thermal isolation shield 630 in a manner similar to that discussed above with respect to FIG. 5. Thermal isolation shield 630 can be made from a highly thermally conductive material with a low emissivity as discussed above and have sidewalls (not shown) that extend from a bottom surface of the shield up towards the chamber cover surrounding the sides of nozzle 610 and base portion 620. In some embodiments, the sidewalls of the thermal isolation shield are in physical contact with a chamber cover (acting as a large thermal mass) that allows the isolation shield to dissipate heat radiated from the gas injection system to the chamber cover.

Example FIB Deposition Process

Figure 7:
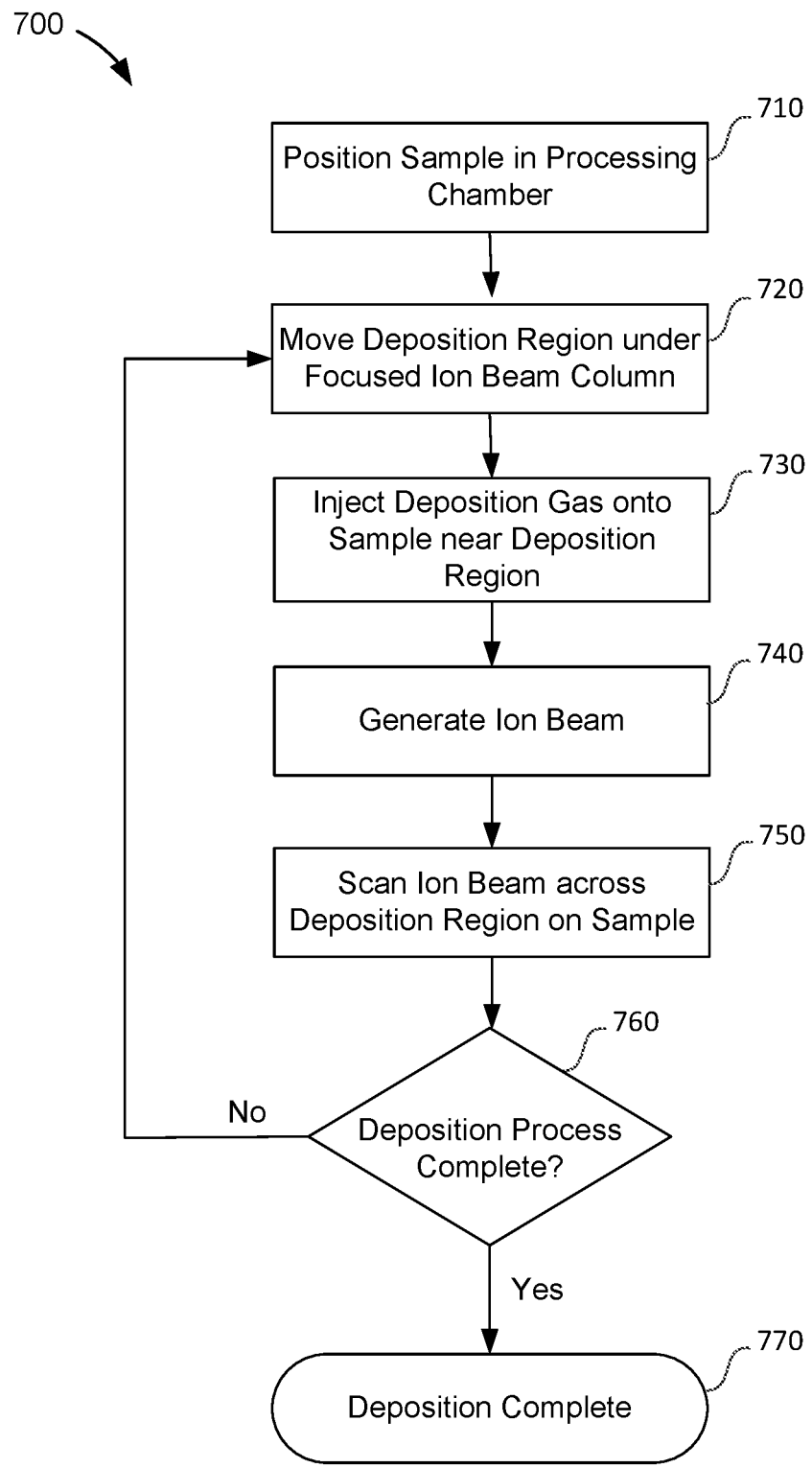
FIG. 7 is a flowchart depicting steps associated a method of depositing material over a sample using a focused ion beam according to some embodiments.
Figure 8:
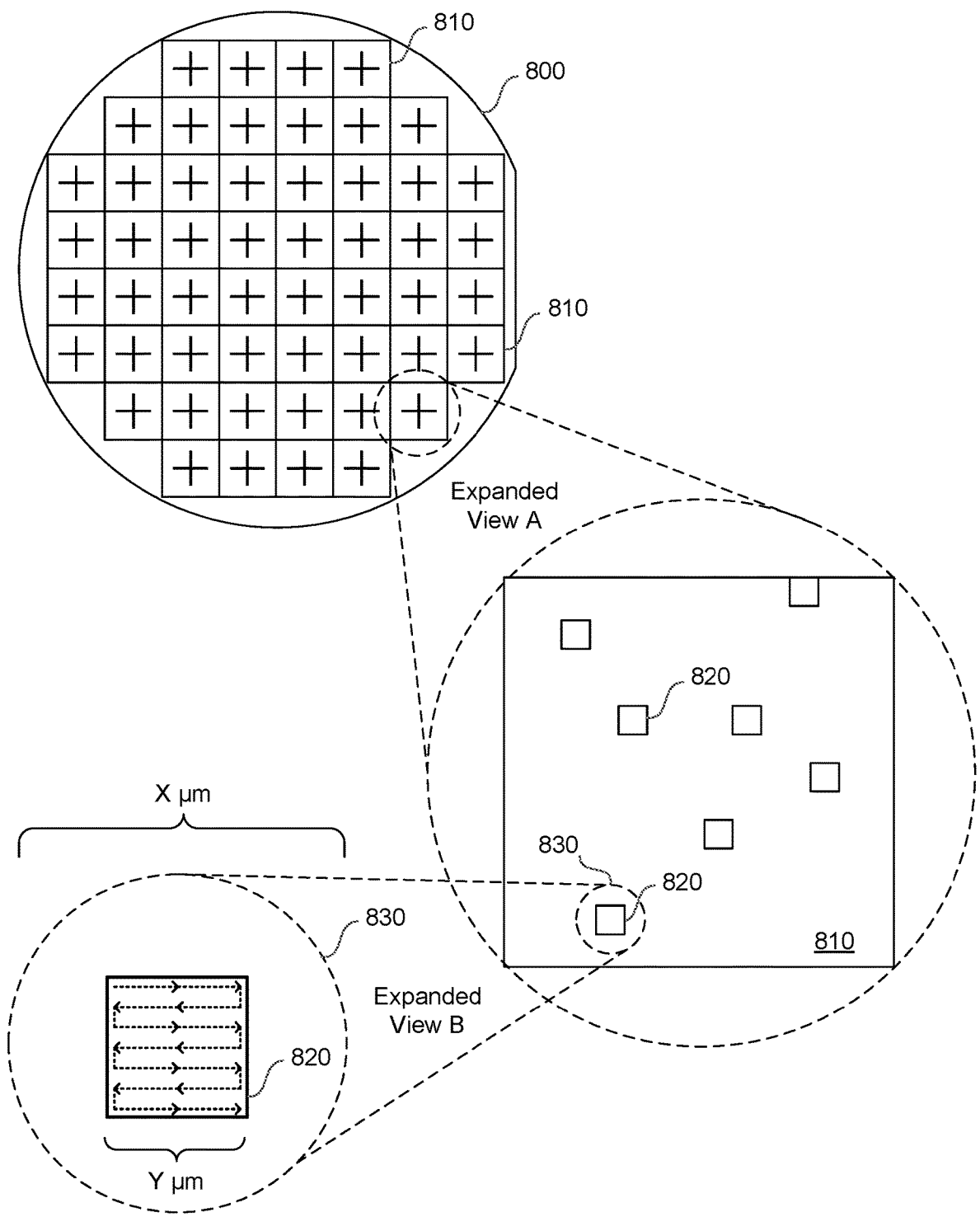
FIG. 8 is a simplified illustration of a sample that can have material deposited over portions of the sample in accordance with the embodiments disclosed herein.

To further illustrate embodiments of the disclosure, reference is made to FIGS. 7 and 8 where FIG. 7 is a flowchart depicting steps associated a method 700 according to some embodiments and FIG. 8 is a simplified illustration of a sample 800 that can be representative of sample 130. Material can be deposited on sample 800 via a charged particle beam enhanced deposition process in accordance with method 700. Method 700 starts by positioning a sample within a processing chamber of a sample evaluation system (block 710). The processing chamber, which can be, for example, chamber 200, can include one or more charged particle beam columns that can be operated in a deposition mode to deposit material over the sample 800 in one or more localized regions. Block 710 can include positioning sample 800 within the vacuum chamber on a sample support, such as support 140.

In many instances, sample 800 will include multiple different regions in which material is to be deposited. For example, FIG. 8 depicts a top view of a sample 800 along with two expanded views of specific portions of sample 800. Sample 800 can be, for example, a 150 mm, a 200 mm or a 300 mm semiconductor wafer, and can include multiple integrated circuits 810 (fifty two in the example depicted) formed thereon. The integrated circuits 810 can be at an intermediate stage of fabrication and method 700 can be used to deposit material over one or more regions 820 of the integrated circuits. For example, Expanded View A of FIG. 8 depicts multiple regions 820 of one of the integrated circuits 810 over which material can be deposited according to the techniques described herein. Expanded View B depicts one of those regions 820 in greater detail.

Referring back to FIG. 7, support 140 can be moved to position such that an area in which material is to be deposited over the sample (e.g., one of regions 820, referred to herein as a "deposition region") is placed directly under the tip of the focused ion beam column (step 720). Next, a deposition precursor gas can be injected into the chamber 110 at a location proximate the deposition region by, for example, gas injection system 150 (step 730), which can be heated as discussed above and shielded from radiating heat towards sample 800 by a thermal isolation shield in accordance with the present disclosure.

During step 730 molecules of the deposition precursor gas adhere to the surface of the sample in accordance with the sticking coefficient of the precursor gas. While gas is being delivered to the deposition region and while the deposition region is cooled, the charged particle beam (e.g., an ion beam) can be generated (step 740) and focused and scanned across a region of interest on the sample (step 750). The charged particle beam can be focused by a focusing lens and scanned across a region of the substrate with one or more deflecting lenses (not shown). As discussed above, the cascade of charged particles from beam 125 can activate molecules of the deposition gas that have adhered to the sample in the deposition region resulting in deposition of material on the sample that is localized to the regions of the sample that over which the ion beam is scanned. For example, the charged particle beam can dissociate the precursor gas breaking the gas down into volatile and non-volatile components where the non-volatile component remains on the surface of the sample as deposited material. While embodiments can be used to deposit many different types of materials and are not limited to the use of any particular deposition precursor gas, as one specific example, the deposition precursor gas can be tungsten hexacarbonyl ($W(CO)_6$) that can be dissociated by the charged particle beam leaving a layer of tungsten material deposited on the sample within the localized deposition region.

In actual implementation, steps 740 and 750 can occur essentially simultaneously and very fast and step 730 can be maintained (i.e., deposition gas can be continuously introduced into the chamber) while the steps 750 and 760 are performed.

Once material from the precursor gas has been deposited in the first deposition, if there are additional areas on the sample in which material is to be deposited (step 760), the sample can be moved via the substrate support to position a next or subsequent deposition area under the tip of the charged particle column (block 720). If not, the deposition process is complete and the sample can be transferred out of system 100 or otherwise processed (step 770).

Additional Embodiments

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. For example, while the embodiments above described a focused ion column as part of a tool having a single charged particle column, in some embodiments the focused ion beam column can be positioned within a SEM-FIB tool that has both a scanning electron microscope column and a focused ion beam column.

Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Also, where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A system for depositing material over a sample in a localized region of the sample, the system comprising:
   a vacuum chamber;
   a thermal mass disposed outside the vacuum chamber;
   a sample support configured to hold a sample within the vacuum chamber during a sample evaluation process;
   a charged particle beam column configured to direct a charged particle beam into the vacuum chamber toward the sample such that the charged particle beam collides with the sample in a deposition region;
   a gas injection system configured to deliver a process gas to the deposition region of the sample; and
   a thermal isolation shield spaced apart from and disposed between the gas injection system and the sample, wherein the thermal isolation shield has a high thermal conductivity and a low emissivity and is thermally coupled to the thermal mass to transfer heat radiated from the gas injection system to the thermal mass.

2. The system set forth in claim 1 wherein the charged particle beam column is a focused ion beam column and the charged particle beam is a focused ion beam.

3. The system set forth in claim 1 further comprising a heating element operatively coupled to heat the gas injection system above room temperature.

4. The system set forth in claim 1 wherein the thermal isolation shield comprises aluminum.

5. The system set forth in claim 1 wherein the gas injection system comprises a gas nozzle that includes a channel formed through a distal end of the nozzle and aligned to allow the focused ion beam to pass through the channel to the sample.

6. The system set forth in claim 1 wherein the gas injection system comprises a base portion and a nozzle extending away from the base portion, wherein the base portion has a thermal mass that is significantly larger than a thermal mass of the nozzle and the thermal shield is disposed between the base portion and the sample and between a portion of the nozzle and the sample.

7. The system set forth in claim 6 wherein the gas nozzle comprises a high emissivity material.

8. The system set forth in claim 7 wherein a distal end of the gas nozzle extends beyond an outer periphery of the thermal shield.

9. The system set forth in claim 8 wherein the distal end of the gas nozzle is coated with a low emissivity material.

10. The system set forth in claim 9 wherein the gas nozzle comprises stainless steel and the distal end of the gas nozzle is coated with aluminum.

11. The system set forth in claim 6 wherein a distal end of the gas nozzle comprises a low emissivity material.

12. The system set forth in claim 11 wherein a distal end of the gas nozzle comprises aluminum.

13. The system set forth in claim 1 wherein the thermal mass is a chamber cover.

14. The system set forth in claim 1 wherein the thermal mass weighs at least 100 kg.

15. A method of depositing material over a sample in a deposition region of the sample with a focused ion beam column, the method comprising:
   positioning a sample within a vacuum chamber such that the deposition region is under a field of view of the focused ion beam column;
   injecting a deposition precursor gas, with a gas injection system, into the vacuum chamber at a location adjacent to the deposition region;
   generating a focused ion beam with the focused ion beam column and focusing the ion beam within the deposition region of the sample; and
   scanning the focused ion beam across the deposition region of the sample to activate molecules of the deposition gas that have adhered to the sample surface in the deposition region and deposit material on the sample within the deposition region,
   wherein, while the focused ion beam is scanned across the deposition region, shielding the sample from heat radiated from the gas injection system with a thermal isolation shield comprising a high conductivity, low emissivity material.

16. The method of depositing material over a sample set forth in claim 15 wherein the charged particle beam column is a focused ion beam column and the charged particle beam is a focused ion beam.

17. The method of depositing material over a sample set forth in claim 15 further comprising heating the gas injection system above room temperature.

18. The method of depositing material over a sample set forth in claim 15 wherein the thermal isolation shield comprises aluminum.

19. The method of depositing material over a sample set forth in claim 15 wherein the gas injection system comprises a gas nozzle that includes a channel formed through a distal end of the nozzle and aligned to allow the focused ion beam to pass through the channel to the sample.

20. The method of depositing material over a sample set forth in claim 15 wherein the gas injection system comprises a base portion and a nozzle extending away from the base portion, wherein the base portion has a thermal mass that is significantly larger than a thermal mass of the nozzle and the thermal shield is disposed between the base portion and the sample and between a portion of the nozzle and the sample.

* * * * *